United States Patent
Dale

(10) Patent No.: US 6,974,774 B1
(45) Date of Patent: Dec. 13, 2005

(54) METHODS OF FORMING A CONTACT OPENING IN A SEMICONDUCTOR ASSEMBLY USING A DISPOSABLE HARD MASK

(75) Inventor: James L. Dale, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/897,258

(22) Filed: Jul. 22, 2004

(51) Int. Cl.⁷ ............................................. H01L 21/44
(52) U.S. Cl. ...................... 438/671; 438/672; 438/637
(58) Field of Search ............................... 438/671, 637, 438/672, 636, 622, 733, 734, 740, 238, 381, 438/311, 933

(56) References Cited

U.S. PATENT DOCUMENTS

| | | | |
|---|---|---|---|
| 5,880,019 A * | 3/1999 | Hsieh et al. ................. | 438/666 |
| 6,174,451 B1 * | 1/2001 | Hung et al. .................... | 216/67 |
| 6,337,285 B1 * | 1/2002 | Ko .............................. | 438/714 |
| 6,458,685 B2 * | 10/2002 | Ko et al. ..................... | 438/621 |
| 6,803,318 B1 * | 10/2004 | Qiao et al. ................... | 438/700 |

* cited by examiner

Primary Examiner—David Nhu
(74) Attorney, Agent, or Firm—David J. Paul

(57) ABSTRACT

Methods to form contact openings and allow the formation of self-aligned contacts for use in the manufacture of semiconductor devices are described. During formation of a multi-layered resist, a hard mask material is introduced beneath an anti-reflective coating to be used as an etch stop layer. The multi-layered resist is patterned and etched, to transfer the desired contact pattern to a substrate material, such as a silicon substrate, to form contact openings therein. The contact openings provide for the formation of self-aligned contacts therein.

9 Claims, 15 Drawing Sheets

METHODS OF FORMING A CONTACT OPENING IN A SEMICONDUCTOR ASSEMBLY USING A DISPOSABLE HARD MASK

FIELD OF THE INVENTION

This invention relates to semiconductor fabrication processing and, more particularly, to methods of patterning contact openings that will allow the formation of self-aligned contacts using a disposable hard mask for semiconductor devices, such as dynamic random access memories (DRAMs).

BACKGROUND OF THE INVENTION

The continuing trend of scaling down integrated circuits has motivated the semiconductor industry to consider new techniques for fabricating precise components at sub-micron levels. As is the case for most semiconductor integrated circuitry, circuit density is continuing to increase at a fairly constant rate and a major area of technological efforts is in fabrication processes to pattern contact locations for interconnection within the integrated circuitry. A typical nanometer lithography process may use a multi-layered resist process, such as a top photoresist layer and an anti-reflective coating. However, anti-reflective photoresist coatings used in the multi-resist process cannot be etched selective to materials used to form self-aligned contact locations during pattern transfer using a conventional anti-reflective coating etch as the etch will not only remove the anti-reflective coating but the underlying material (i.e., nitride) as well.

Typical multi-layered resist processing does not allow for the anti-reflective coating to be removed before complete pattern transfer from the multi-layered resist to the underlying material takes place. If the anti-reflective coating is not removed before complete pattern transfer, then problems will occur, two of which are: 1) when the anti-reflective coating is removed a partial pattern transfer will occur in the underlying materials and 2) the anti-reflective coating will lift off during subsequent removal of the remaining layers of the multi-layered resist.

For example, when employing a standard fabrication process to pattern multi-layered resist (i.e., a top photoresist layer and an anti-reflective coating), the anti-reflective coating is removed after an anti-reflective coating/carbon etch is performed. In this case, the anti-reflective coating etch has selectivity to the underlying material (i.e., nitride) and the anti-reflective coating. With the anti-reflective coating being present when the resist is stripped, the anti-reflective coating will peel off of the underlying carbon, which is a highly undesirable occurrence during the patterning stage as the desired pattern will be affected. Thus, conventional multi-resist processing using an anti-reflective coating, is not suitable for use in the formation of self-aligned contact openings (or vias) due to etch selectivity requirements to underlying materials.

What is needed is a method to successfully pattern and etch contact openings and ultimately to form self-aligned contacts therein, by using a multi-resist process, which employs anti-reflective materials, in order to achieve the nanometer line widths now being demanded in current and future semiconductor fabrication processes.

SUMMARY OF THE INVENTION

An exemplary implementation of the present invention includes a method to form contact openings that will allow the formation of self-aligned contacts for use in the manufacture of semiconductor devices. During the formation of the multi-layered resist, a hard mask material is introduced beneath an anti-reflective coating to be used as an etch stop layer. The multi-layered resist is patterned and etched to transfer the desired contact pattern to a substrate material, such as a silicon substrate, to form contact openings therein. The contact openings now provide for the formation of self-aligned contacts therein.

DETAILED DESCRIPTION OF THE INVENTION

In the following description, the terms "wafer" and "substrate" are to be understood as a semiconductor-based material including silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in or over the base semiconductor structure or foundation. In addition, the semiconductor need not be silicon-based, but could be based on silicon-germanium, silicon-on-insulator, silicon-on-saphire, germanium, or gallium arsenide, among others.

An exemplary implementation of the present invention and variations thereof are directed to processes for forming self-aligned contact openings and self-aligned contacts in a semiconductor device as depicted in the embodiments of FIGS. 1–22.

Figure 1:
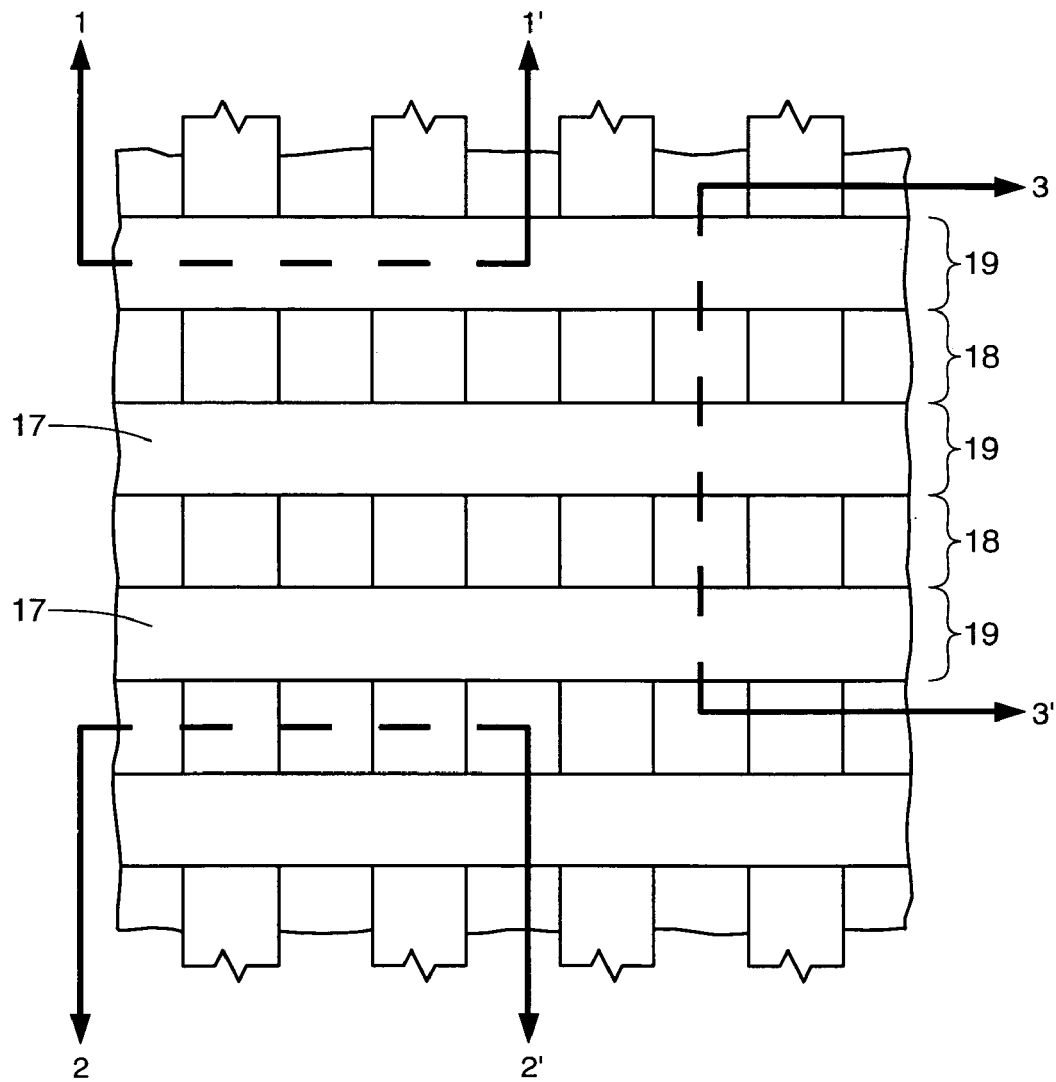
FIG. 1 is top-down view of a semiconductor substrate section or semiconductor assembly, covered with a multiple-layered resist patterned by photolithography.
Figure 2:
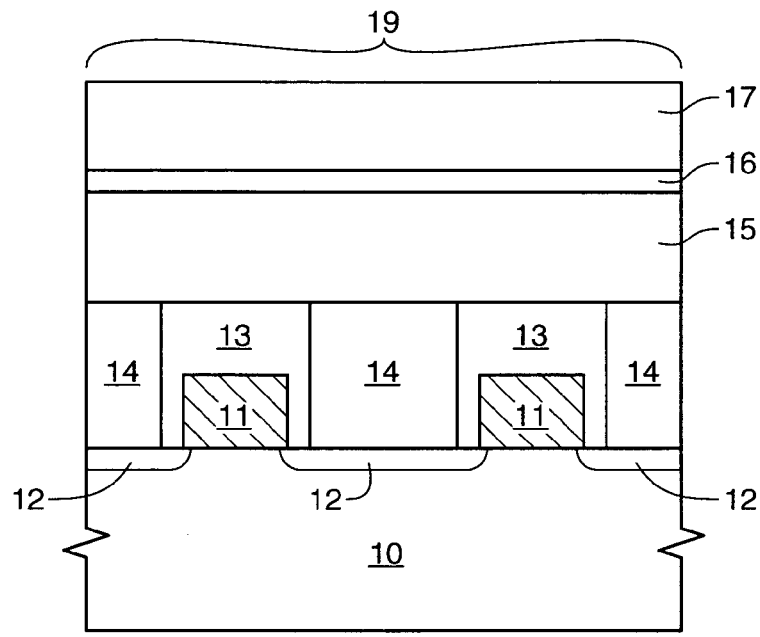
FIG. 2 is a cross-sectional view taken through line 1–1' of FIG. 1 showing a semiconductor substrate section depicting isolated transistor structures covered with a disposable hard mask material and a multiple-layered resist comprising an anti-reflective layer and a non-exposed region of a photoresist layer.
Figure 3:
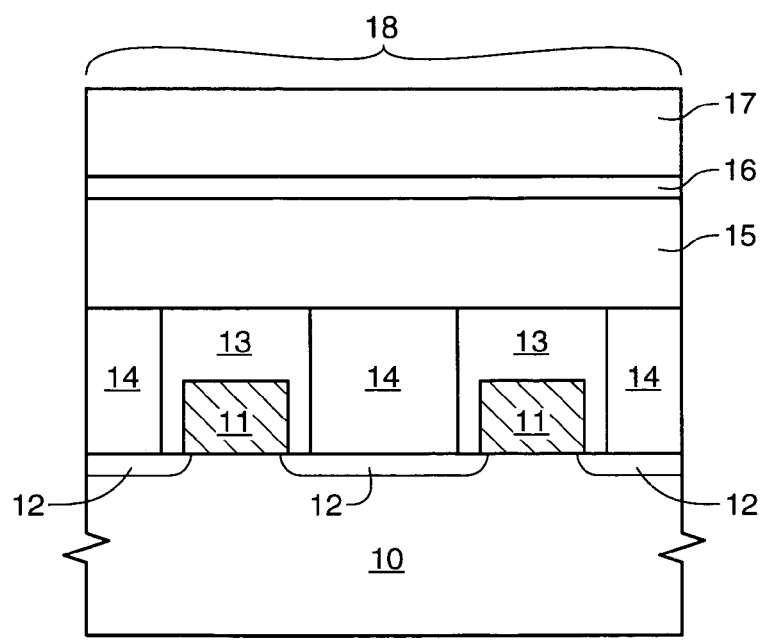
FIG. 3 is a cross-sectional view taken through line 2–2' of FIG. 1 showing a semiconductor substrate section depicting isolated transistor structures covered with a disposable hard mask material and a multiple-layered resist comprising an anti-reflective layer and an exposed region of a photoresist layer.
Figure 4:
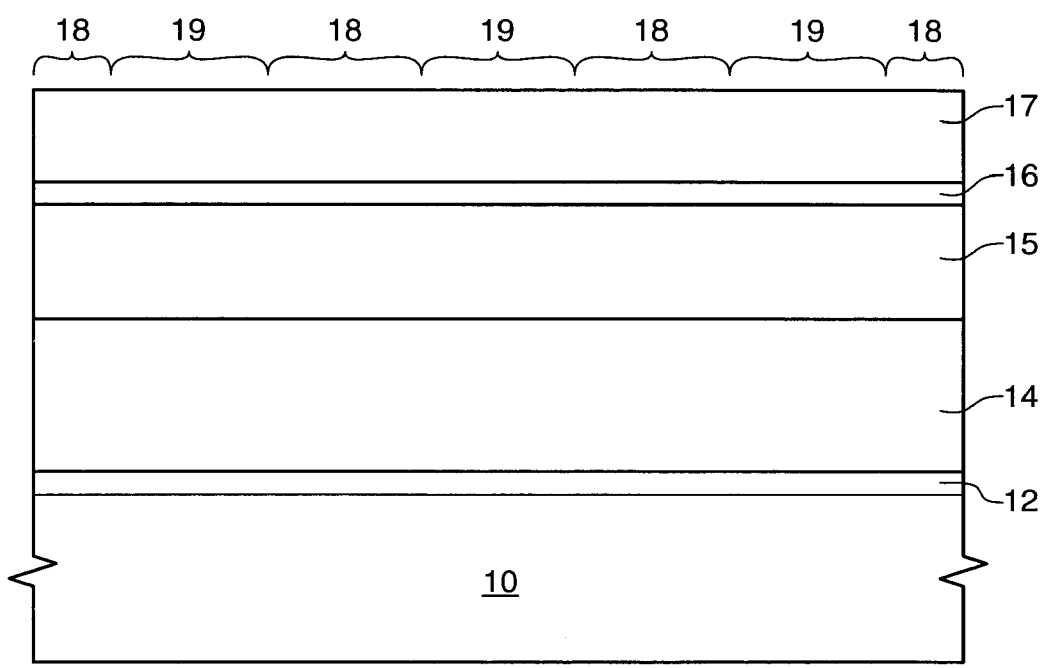
FIG. 4 is a cross-sectional view taken through line 3–3' of FIG. 1 showing a semiconductor substrate section isolation material covered with a disposable hard mask material and a multiple-layered resist comprising an anti-reflective layer (or coating) and a photoresist layer having exposed and non-exposed regions.

FIG. 1 is top-down view of a semiconductor substrate section covered with a multiple-layered resist patterned by photolithography. FIGS. 2–4 are cross-sectional views taken through various regions of the semiconductor substrate to demonstrate the results of photolithography patterning steps. The process steps used to form a desired pattern on a semiconductor substrate assembly may be conventional processing steps know to those skilled in the art.

Referring to the cross-sectional view of FIG. 2, taken through line 1–1' of FIG. 1, a semiconductor substrate section 10 depicting transistor structures comprising transistor source/drain regions 12 spanning between transistor gate structures 11, covered by gate insulation 13, with each transistor gate structure isolated from one-another by transistor gate isolation regions 14 formed from isolation material such as oxide. A disposable mask material 15, such as amorphous carbon or transparent carbon materials, is first placed on isolation material 14. Next, a multiple-layered resist, comprising an anti-reflective layer 16 and an overlying photoresist layer 17, is formed on disposable mask material 15. As shown in FIG. 2, photoresist layer 17 in this area of the substrate is not exposed to ultraviolet radiation and is depicted as such by non-exposed regions 19.

FIG. 3 is a cross-sectional view taken through line 2–2' of FIG. 1 showing the semiconductor substrate section 10 depicting transistor structures comprising transistor source/drain regions 12 spanning between transistor gate structures 11, covered by gate insulation 13, with each transistor gate structure isolated from one-another by transistor gate isolation material 14. A disposable mask material 15, such as amorphous carbon or transparent carbon materials, is first placed on isolation material 14. Next, a multiple-layered resist comprising an anti-reflective layer 16 and an overlying photoresist layer 17 is formed on disposable mask material 15. As shown in FIG. 3, photoresist layer 17 in this area of the substrate is exposed to ultraviolet radiation and is depicted as such by exposed regions 18.

In FIG. 4, a cross-sectional view taken through line 3–3' of FIG. 1, the semiconductor substrate section 10 in this region shows runs perpendicular to the cross-sectional views of FIGS. 2 and 3 to show isolation material 14 overlying source/drain region 12. This view shows transistor gate isolation material 14 (i.e., oxide 14) covered with disposable mask material 15, such as amorphous carbon or transparent carbon materials, and multiple-layered resist comprising anti-reflective layer 16 and photoresist layer 17, with both exposed regions 18 and non-exposed regions 19 being shown in this area and due to the photo-lithography pattern.

Figure 5:
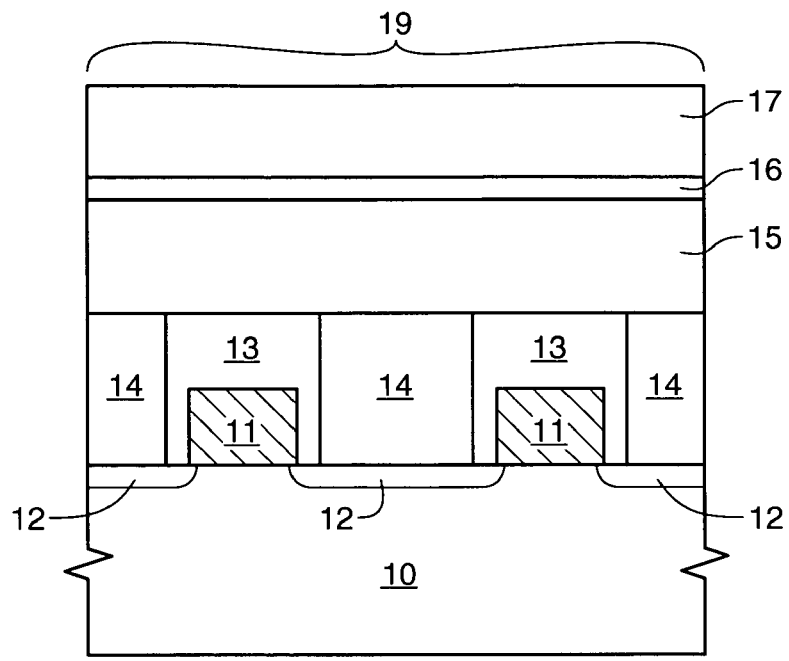
FIG. 5 is a subsequent cross-sectional view taken from FIG. 2 following the removal of exposed photoresist regions with the non-exposed regions of photoresist remaining.
Figure 6:
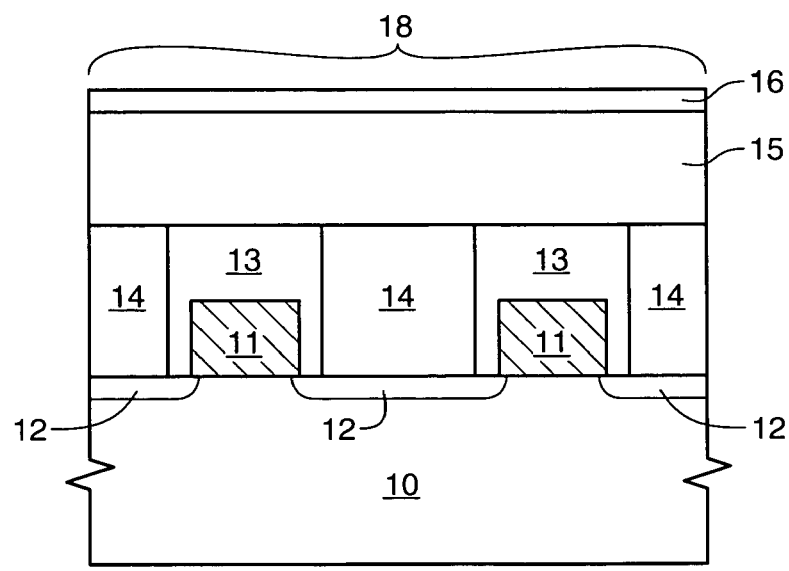
FIG. 6 is a subsequent cross-sectional view taken from FIG. 3 following the removal of exposed photoresist regions.
Figure 7:
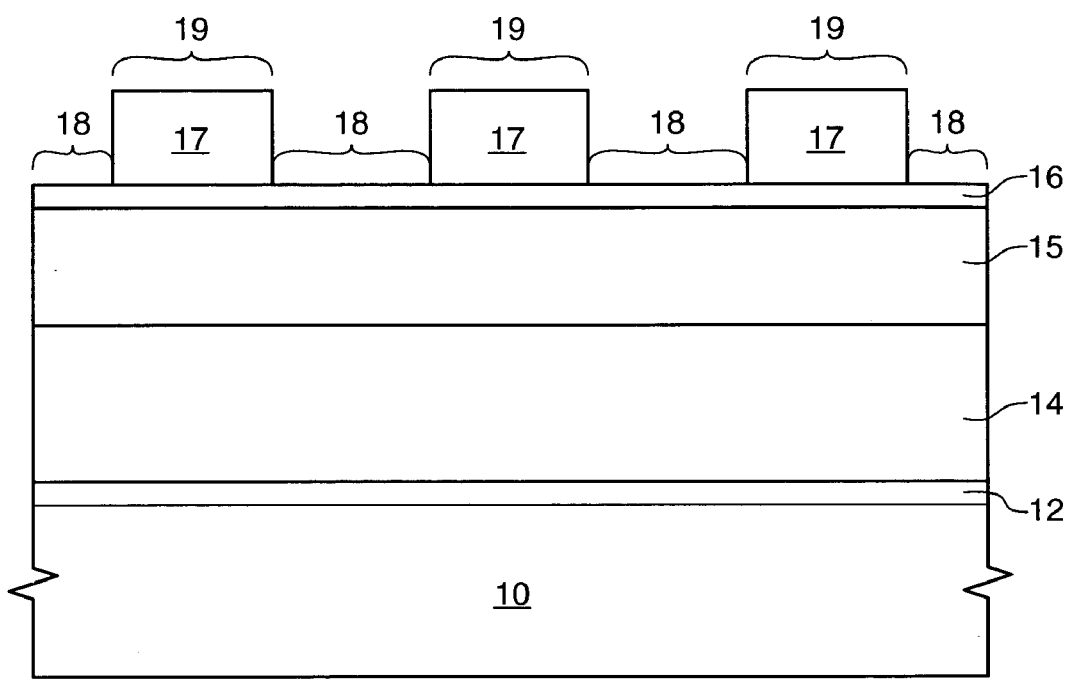
FIG. 7 is a subsequent cross-sectional view taken from FIG. 4 following the removal of exposed photoresist regions with the non-exposed regions of photoresist remaining.

FIGS. 5–7 depict subsequent cross-sectional views that correspond to FIGS. 2–4, respectively, to demonstrate the results following the removal of exposed regions of photoresist 17. In FIG. 5 (a cross-sectional view taken from FIG. 2), photoresist 17 remains in place as this region of photoresist was not exposed during the previous photo-lithography patterning step. Thus, there is no change to this region of the semiconductor substrate between FIGS. 5 and 2 at this point.

However, as shown in FIG. 6, a subsequent cross-sectional view corresponding to FIG. 3, photoresist 17 has been removed as this area of the semiconductor substrate contained exposed photoresist regions 18 that are seen previously in FIG. 3. With photoresist 17 stripped, underlying anti-reflective layer 16 is now exposed.

In a perpendicular view to FIGS. 5 and 6, FIG. 7, a subsequent cross-sectional view corresponding to FIG. 4, shows the results following the removal of photoresist 17 at exposed regions 18 thereby exposing the underlying regions of anti-reflective layer 16, while leaving non-exposed regions of photoresist 17 remaining.

Figure 8:
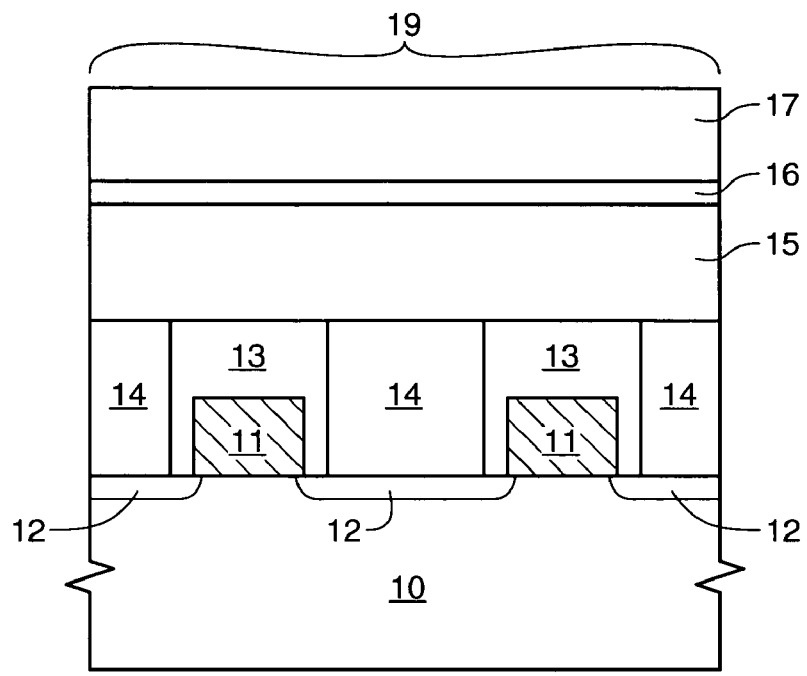
FIG. 8 is a subsequent cross-sectional view taken from FIG. 5 following the removal of exposed regions of the anti-reflective coating with the non-exposed regions of anti-reflective coating remaining.
Figure 9:
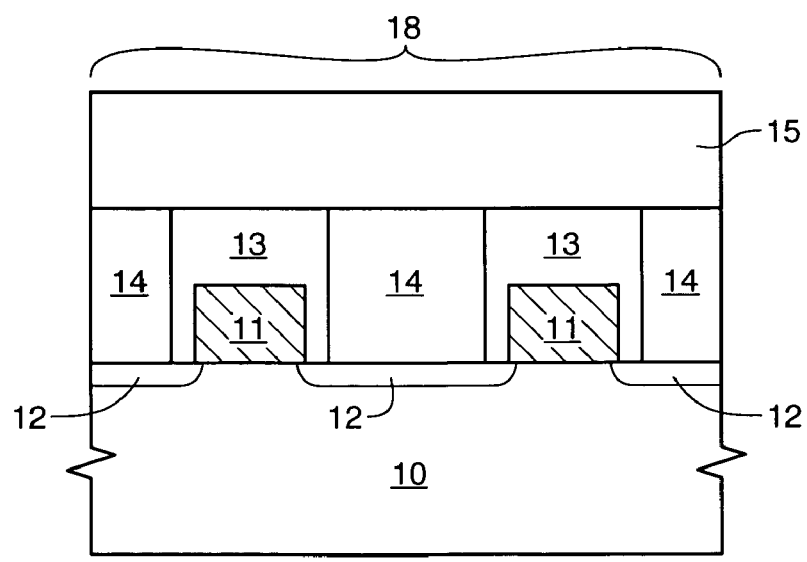
FIG. 9 is a subsequent cross-sectional view taken from FIG. 6 following the removal of exposed regions of the anti-reflective coating.
Figure 10:
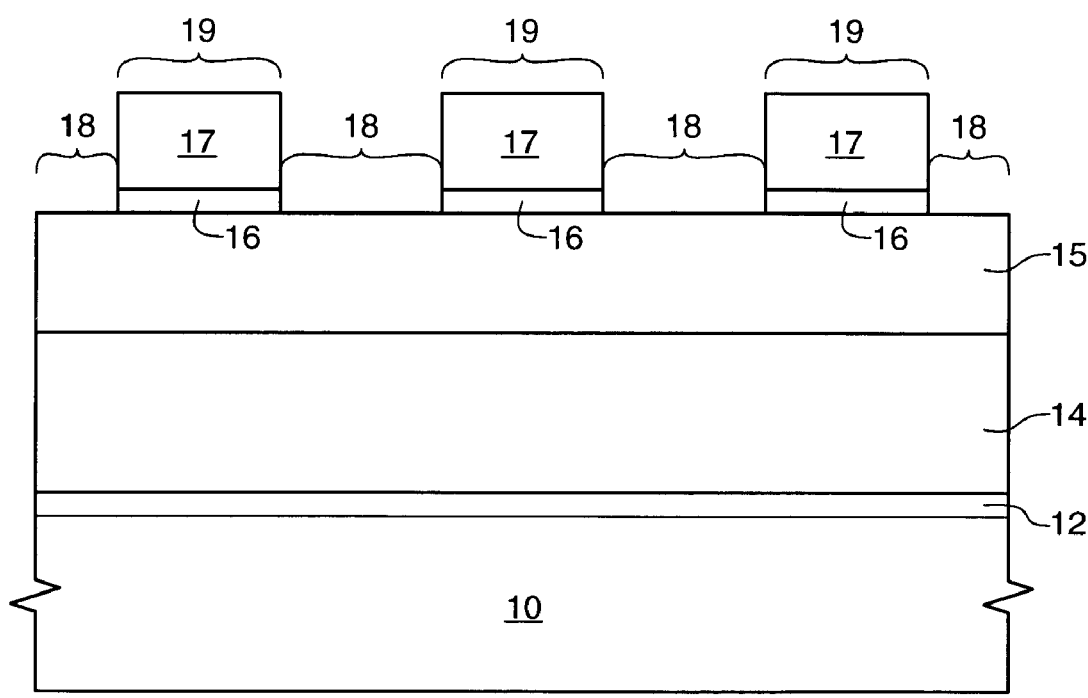
FIG. 10 is a subsequent cross-sectional view taken from FIG. 7 following the removal of exposed regions of the anti-reflective coating with the non-exposed regions of anti-reflective coating remaining.

FIGS. 8–10 depict subsequent cross-sectional views that correspond to FIGS. 5–7, respectively, to demonstrate the results following an etch to strip exposed regions of anti-reflective layer 16. For example, an etch using He/$CF_4$ for a period of approximately 15 seconds can be used to strip exposed regions of anti-reflective layer 16. As shown in FIG. 8, a subsequent cross-sectional view corresponding to FIG. 5, the anti-reflective layer 16 has not been exposed as it is still covered with photoresist 17. Thus as shown in FIG. 8, in the area of the semiconductor substrate covered with photoresist 17, none of anti-reflective layer 16 is removed.

FIG. 9 is a subsequent cross-sectional view corresponding to FIG. 6, following the removal of exposed regions of the anti-reflective layer 16. During an etch to remove anti-reflective layer 16 the underlying hard mask material 15, remains completely intact while the anti-reflective layer 16 is completely stripped.

FIG. 10 is a subsequent cross-sectional view corresponding to FIG. 7, following the removal of exposed regions 18 of the anti-reflective layer 16 with the non-exposed regions 19 of anti-reflective layer 16 remaining. The underlying hard mask material 15 remains completely intact while the anti-reflective layer 16 is completely stripped in the exposed regions 18. Following the anti-reflective material etch the semiconductor assembly is now ready for the following etching procedure as depicted in FIGS. 11–13.

Figure 11:
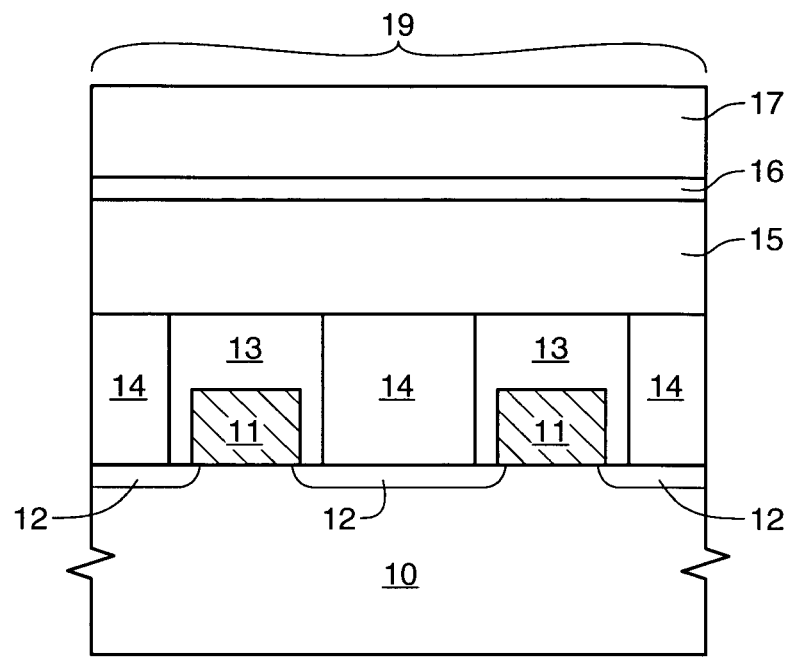
FIG. 11 is a subsequent cross-sectional view taken from FIG. 8 following a partial etch of exposed regions of a disposable hard mask material.
Figure 12:
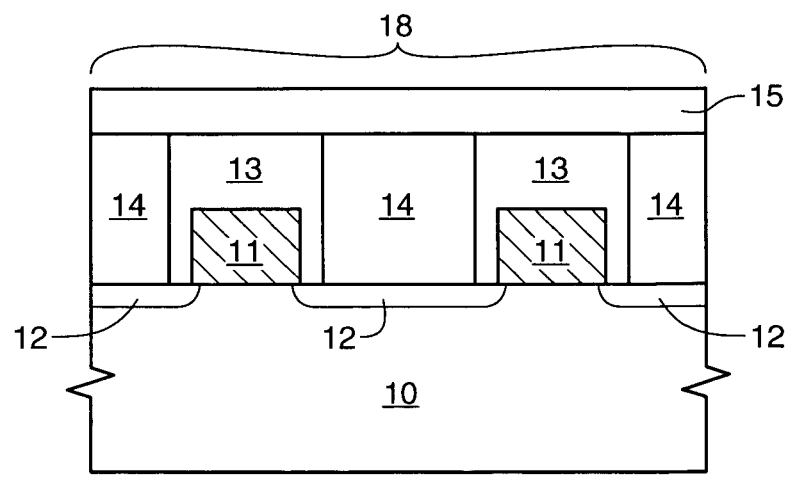
FIG. 12 is a subsequent cross-sectional view taken from FIG. 9 following a partial etch of exposed regions of a disposable hard mask material.
Figure 13:
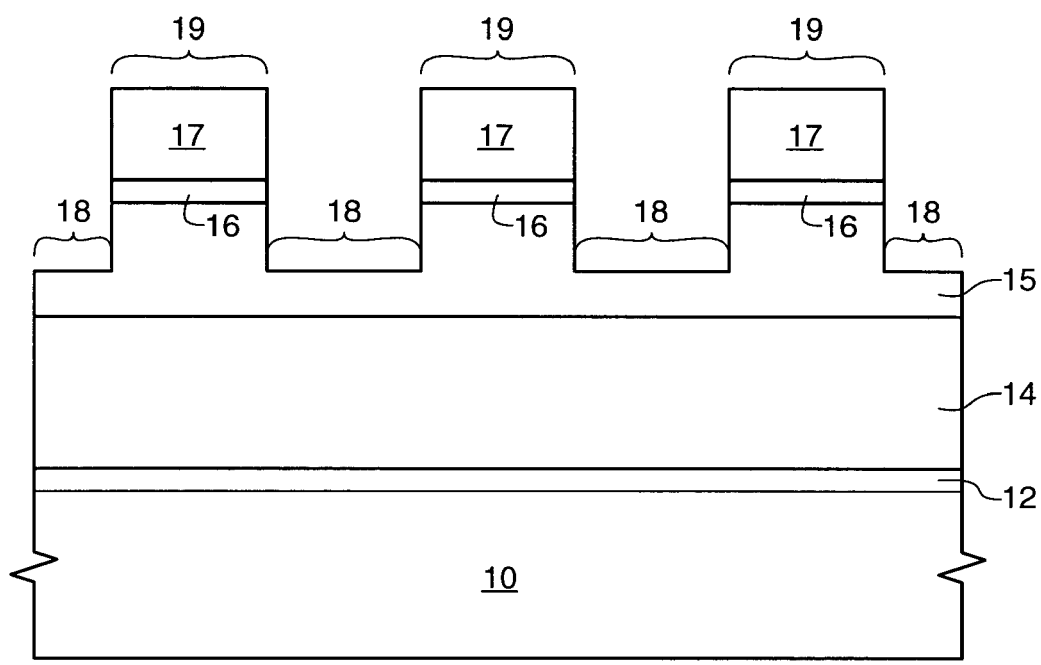
FIG. 13 is a subsequent cross-sectional view taken from FIG. 10 following a partial etch of exposed regions of a disposable hard mask material.

FIGS. 11–13, show cross-sectional views of the semiconductor assembly after a timed partial hard mask etch is preformed. Referring to FIG. 11, a subsequent cross-sectional view corresponding to FIG. 8, the partial hard mask etch is performed to remove an upper portion of the now exposed hard mask material 15. As shown in FIG. 11, the anti-reflective layer 16 has not been exposed as it is still covered with photoresist 17. Obviously, in the area of the semiconductor substrate that remains covered with photoresist 17, no anti-reflective coating material is removed.

Figure 20:
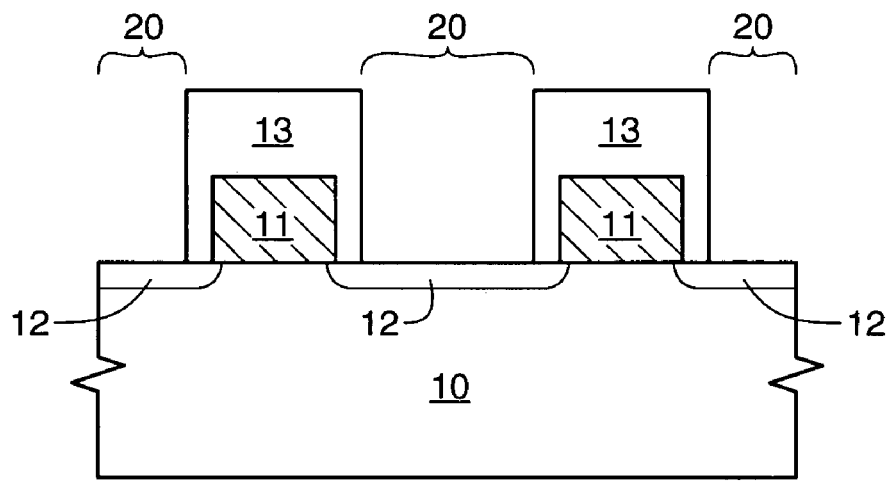
FIG. 20 is a subsequent cross-sectional view taken from FIG. 18 following an etch of the isolation material to form self-aligned openings that provide access to source/drain areas between transistor gates.
Figure 21:
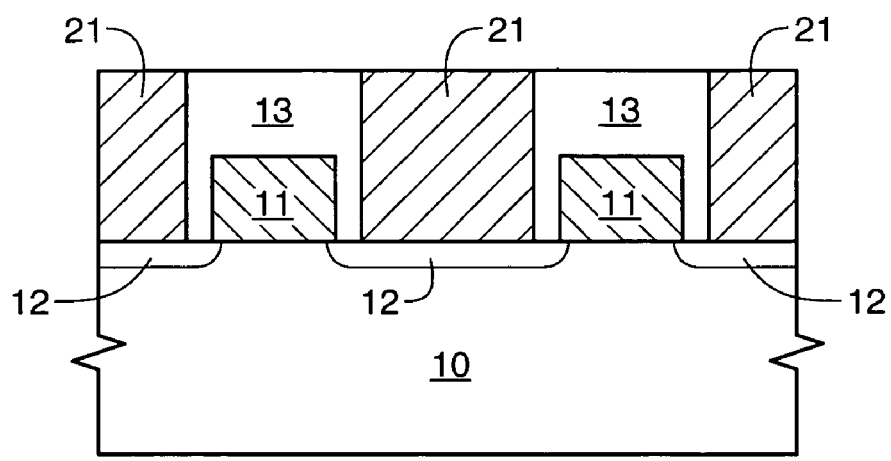
FIG. 21 is a subsequent cross-sectional view taken from FIG. 20 following the formation of self-aligned contacts to source/drain areas between transistor gates.

Referring to FIG. 12, a subsequent cross-sectional view corresponding to FIG. 9, a partial etch is performed to remove an upper portion of the now exposed hard mask material 15. This partial etch of hard mask material 15 is a timed etch such that at least half the thickness of the hard mask material is removed. The minimum thickness of the hard mask to be removed is determined by the amount of hard mask material (i.e., carbon) that will be removed during a subsequent via opening etch (such as an oxide etch if the underlying isolation material is oxide) performed to open the self-aligned contacts, as depicted in FIGS. 20 and 21.

For example, after defining the desired feature in the hard mask, the via opening etch mentioned above is performed that will remove approximately 10% of the hard mask. In one scenario, if the subsequent via opening etch removes approximately 500 angstroms of carbon, then the minimum thickness of hard mask removed during the partial etch will be around twice that or approximately 1000 angstroms. For example, performing a $SO_2/O_2$ etch for a period of approximately 55 seconds will successfully remove approximately 1000 angstroms of the hard mask (carbon).

In another scenario, if the hard mask is approximately 2000 angstroms, by etching down approximately 1000 angstroms during the partial hard mask etch, the resist and the anti-reflective coating are removed. As the partial etch continues, the remaining underlying hard mask material will be approximately 1000 angstroms. The subsequent via oxide etch will remove around 100 angstroms of the hard mask. Thus, in this scenario it is preferred to have a minimum of 500 angstroms of hard mask material remaining during the via opening etch. A partial etch using $SO_2/O_2$ will then need adjusted to successfully remove the desired amount of carbon.

Referring to FIG. 13, a subsequent cross-sectional view corresponding to FIG. 10, at the exposed regions 18 the hard mask material 15 is removed as indicated in FIG. 12 by the partial hard mask etch.

Figure 14:
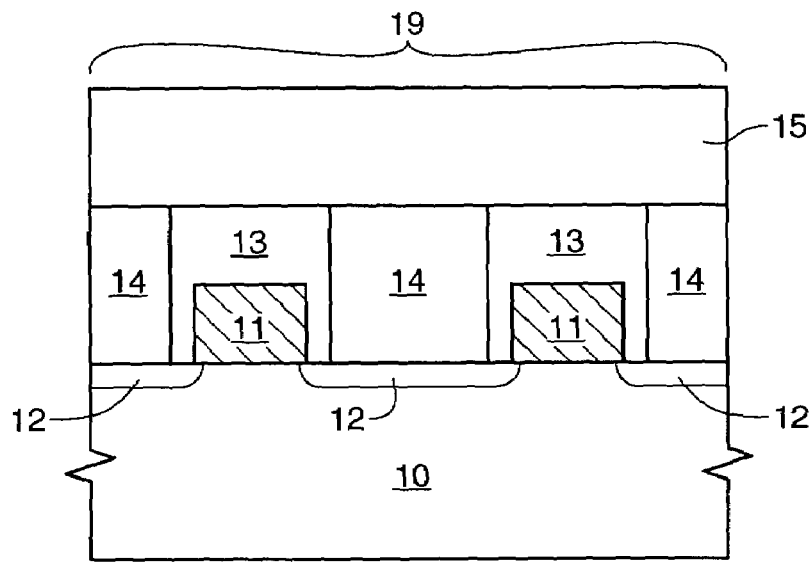
FIG. 14 is a subsequent cross-sectional view taken from FIG. 11 following a photoresist and anti-reflective coating strip.
Figure 15:
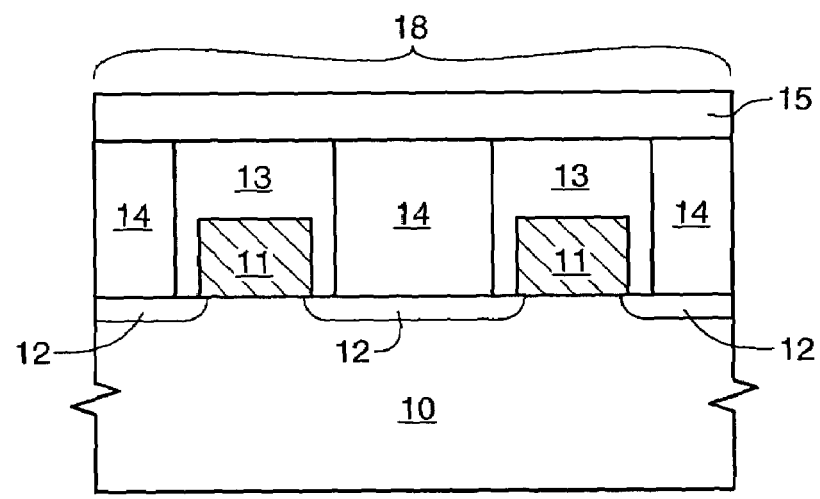
FIG. 15 is a subsequent cross-sectional view taken from FIG. 12 following a photoresist and anti-reflective coating strip.
Figure 16:
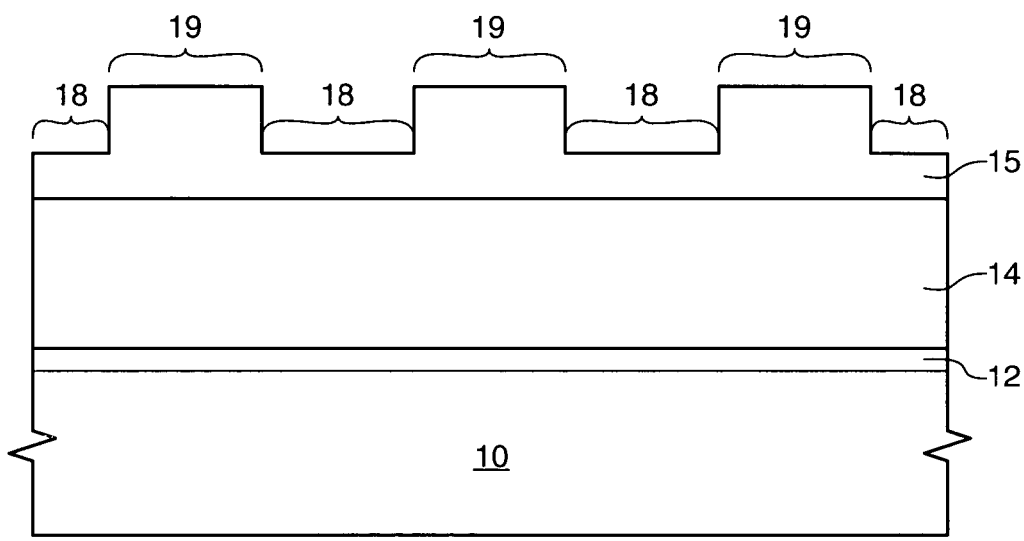
FIG. 16 is a subsequent cross-sectional view taken from FIG. 13 following a photoresist and anti-reflective coating strip.

FIGS. 14–16, show cross-sectional views of the semiconductor assembly after a partial photoresist and anti-reflective coating strip is preformed. Referring to FIG. 14, a subsequent cross-sectional view corresponding to FIG. 11, hard mask material 15 is now exposed following the removal of photoresist 17 and anti-reflective coating 16 seen in FIG. 11. The maximum amount of hard mask material 15 removed is determined by the amount of the mask material (i.e., carbon) removed during the anti-reflective coating strip. For example, performing a $SO_2/O_2$ etch for a period of approximately five seconds removes approximately 100 angstroms of carbon. Thus, if the anti-reflective etch step removes approximately 100 angstroms of carbon, then the maximum amount of hard mask material 15 removed must be such that a minimum of approximately 200 angstroms of carbon remains in the exposed areas.

In FIG. 15, a subsequent cross-sectional view corresponding to FIG. 12, the photoresist and anti-reflective coating have been removed in previous process steps so this cross-sectional view does not show any change following the photoresist and anti-reflective coating strip.

Referring to FIG. 16, a subsequent cross-sectional view corresponding to FIG. 13, hard mask material 15 is now exposed following the removal of photoresist 17 and anti-reflective coating 16 seen in FIG. 13.

Figure 17:
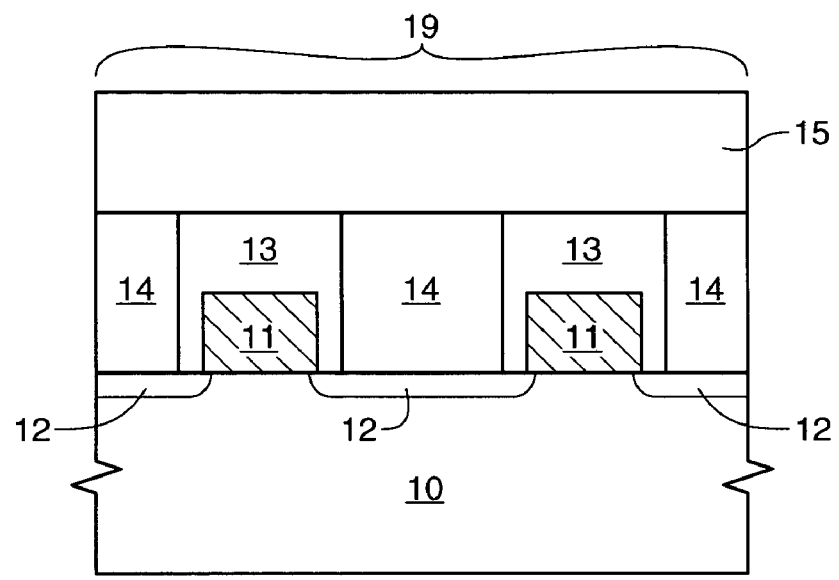
FIG. 17 is a subsequent cross-sectional view taken from FIG. 14 following a hard mask etch.
Figure 18:
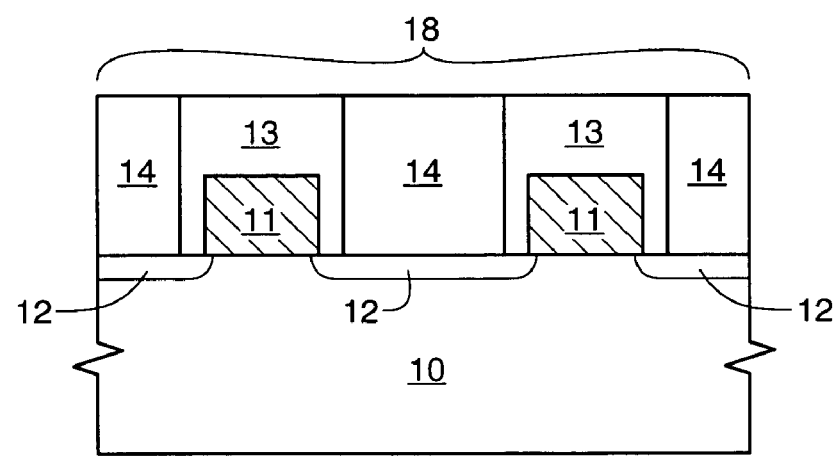
FIG. 18 is a subsequent cross-sectional view taken from FIG. 15 following a hard mask etch.
Figure 19:
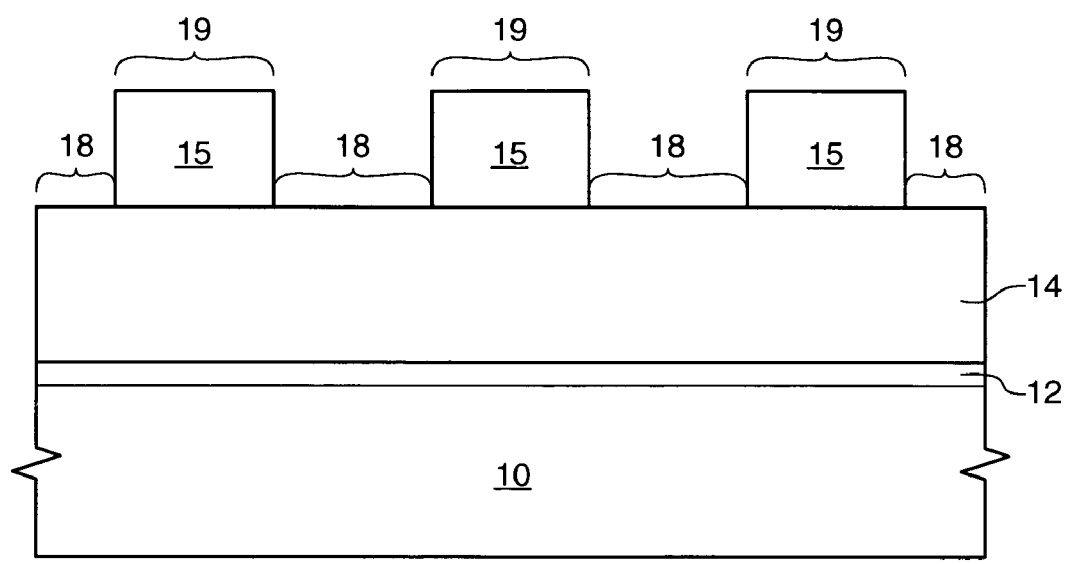
FIG. 19 is a subsequent cross-sectional view taken from FIG. 16 following a hard mask etch.

FIGS. 17–19, show cross-sectional views of the semiconductor assembly after a hard mask etch is preformed. In FIGS. 17–19, the hard mask etch removes an amount of hard mask material 15 that corresponds to the remaining thickness of hard mask material 15 that is resident in the exposed regions 18, as seen in FIG. 16. FIGS. 18 and 19 give the best illustration to depict the effects of the hard mask etch even though this etch effects all areas of the semiconductor assembly as depicted in the three cross-sectional views of FIGS. 17–19.

Referring to FIG. 17, a subsequent cross-sectional view corresponding to FIG. 14, a hard mask etch removes a portion of hard mask material 15 that was resident in non-exposed regions 19.

Referring to FIG. 18, a subsequent cross-sectional view corresponding to FIG. 15, a hard mask etch removes the remaining hard mask material 15 that was resident in exposed regions 18 (seen in FIG. 15) and the etch stops when isolation material 14 (in this example oxide 14) and gate insulation material 13 are encountered (insignificant amounts of isolation oxide 14 and gate insulation material 13 may be removed during this etch step). For example, performing an $O_2/SO_2$ etch for a period of approximately 30 seconds will successfully remove the remaining hard mask material 15 that is exposed.

Referring to FIG. 19, a subsequent cross-sectional view corresponding to FIG. 16, the final hard mask etch removes the remaining hard mask material 15, that was resident in exposed regions 18 (seen in FIG. 16), removes the corresponding amount of hard mask material 15 in non-exposed regions 19 and the etch stops when isolation oxide 14 is encountered. At this point in the process, the semiconductor assembly is now ready for an etch step that will form self-aligned contact openings as depicted in FIGS. 20 and 21.

Referring to FIG. 20, a subsequent cross-sectional view corresponding to FIG. 18, a via opening etch of the isolation material 14 is performed to create self-aligned openings 20 that provide access to source/drain areas 12 between transistor gates. The via opening etch will etch isolation material 14, such as oxide, selective to gate insulation material 13, such as nitride and thus form the self-aligned contact openings therein. As explained in previous process steps, the via opening etch must be taken into account to determine the amount of hard mask material to remove in the partial etch step of the hard mask material. Finally, after the via opening etch, a hard mask etch is performed to strip any remaining hard mask material from the present surface of the semiconductor assembly.

The examples provided herein suggest layer thicknesses, etching solutions and etching rates and serve as exemplary implementations of the present invention and are not intended to limit the scope of the present invention. One skilled in the art has the knowledge to substitute etching solutions and etching rates of various materials used to obtain the desired removal of the types of materials and material thicknesses used in a given process.

Referring to FIG. 21, a subsequent cross-sectional view corresponding to FIG. 20, self-aligned contacts 21 are formed to connect to source/drain areas between transistor gates, by methods know to those skilled in the art.

Figure 22:
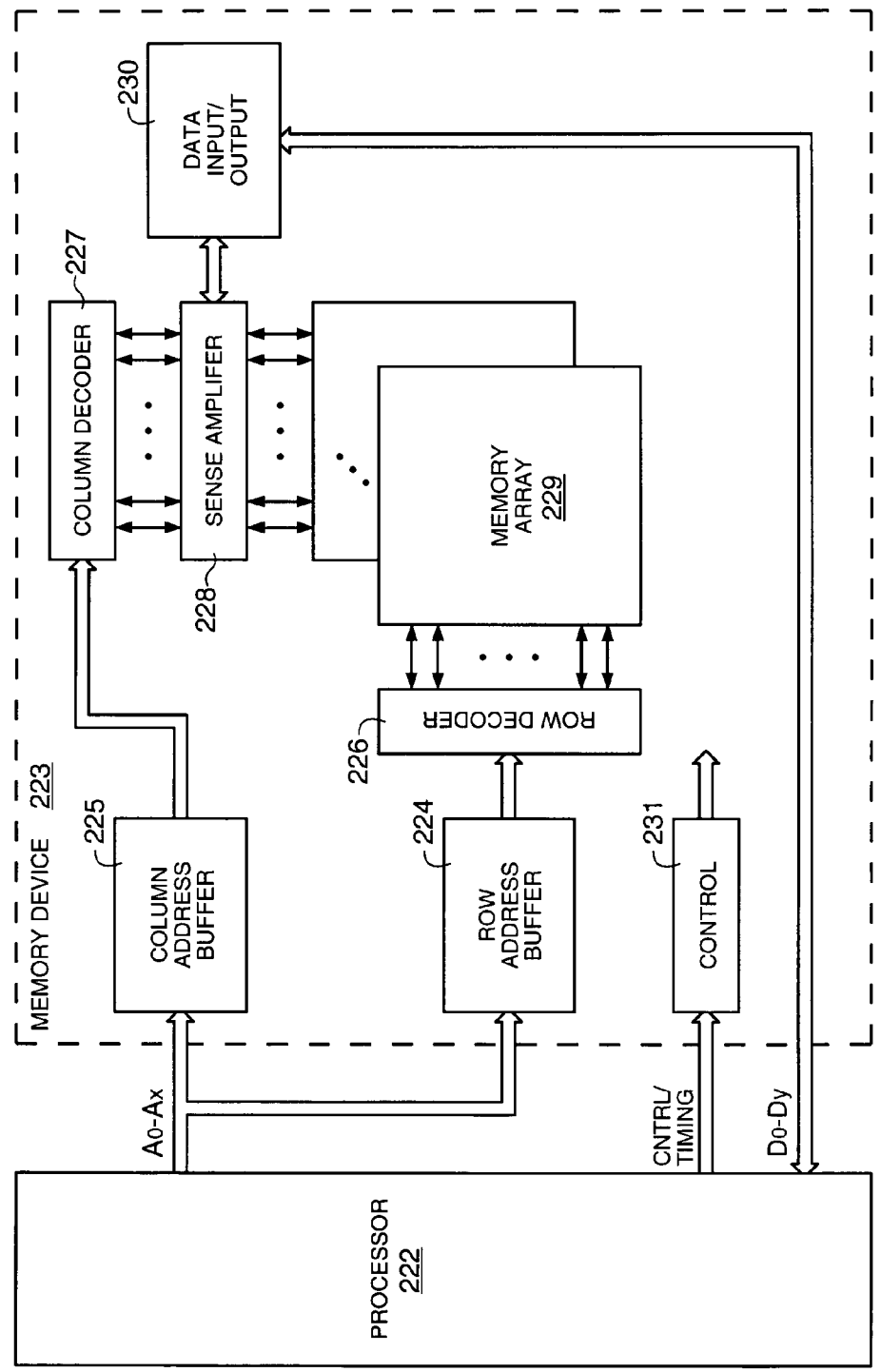
FIG. 22 is a simplified block diagram of a semiconductor system comprising a processor and memory device to which the present invention may be applied.

Implementation of the present invention to form self-aligned contact openings and self-aligned contacts in semiconductor devices may be applied to a semiconductor system, such as the one depicted in FIG. 22. FIG. 22 represents a general block diagram of a semiconductor system, the general operation of which is known to one skilled in the art, the semiconductor system comprising a processor 222 and a memory device 223 showing the basic sections of a memory integrated circuit, such as row and column address buffers 224 and 225, row and column decoders, 226 and 227, sense amplifiers 228, memory array 229 and data input/output 230, which are manipulated by control/timing signals from the processor through control 231.

It is to be understood that although the present invention has been described with reference to a preferred embodiment, various modifications, known to those skilled in the art, such as utilizing the disclosed methods to form self-aligned contacts in any semiconductor device or semiconductor assembly, may be made to the process steps presented herein without departing from the invention as recited in the several claims appended hereto.

What is claimed is:

1. A method of forming self-aligning contact openings for a semiconductor assembly comprising the following sequence of steps:
   patterning exposed regions and non-exposed regions of a multi-layered resist material comprising a photoresist layer overlying an anti-reflective layer, the multi-layered resist overlying a hard mask material;
   removing the photoresist layer and the anti-reflective layer in the exposed regions to expose an underlying area of the hard mask material;
   partially removing the hard mask material in the exposed underlying area such that at least half the thickness of the hard mask material is removed;
   removing the photoresist layer and the anti-reflective layer in the non-exposed regions;
   further removing the hard mask material in the exposed underlying area until an underlying isolation material is encountered and the hard mask material is completely cleared from the underlying isolation material; and
   removing the underlying isolation material at the exposed regions to form the self-aligning contact openings.

2. The method of claim 1, wherein the hard mask material is carbon material.

3. The method of claim 2, wherein the carbon material is amorphous carbon or transparent carbon.

4. A method of forming openings in a substrate for a semiconductor assembly comprising:
   forming a disposable hard mask material over an isolation material;
   forming a multi-layered resist material on the disposable hard mask material;
   patterning exposed regions and non-exposed regions in the multi-layered resist material;
   removing the multi-layered resist material in the exposed regions to expose an underlying area of the hard mask material;
   partially removing the hard mask material in the exposed underlying area such that a sufficient thickness of the hard mask material remains to cover the isolation material;
   removing the multi-layered resist material in the non-exposed regions;
   further removing the hard mask material in the exposed underlying area until an underlying isolation material is encountered and the hard mask material is completely cleared from the underlying isolation material; and
   removing the underlying isolation material at the exposed regions to form the openings therein.

5. The method of claim 4, wherein the sufficient thickness of the remaining hard mask material is less than half an original thickness of the hard mask.

6. The method of claim 4, wherein the hard mask material is carbon material.

7. The method of claim 4, wherein the carbon material is amorphous carbon or transparent carbon.

8. A method of forming self-aligning contact openings for a semiconductor assembly comprising the following sequence of steps:
   patterning exposed regions and non-exposed regions of a multi-layered resist material comprising a photoresist layer overlying an anti-reflective layer, the multi-layered resist material overlying a disposable carbon layer;
   removing the photoresist layer and the anti-reflective layer in the exposed regions to expose an underlying area of the carbon layer;
   partially removing the carbon layer in the exposed underlying area such that at least half the thickness of the carbon layer is removed;
   removing the photoresist layer and the anti-reflective layer in the non-exposed regions;
   etching the carbon layer in the exposed underlying area until an underlying isolation material is encountered and the carbon layer is completely cleared from the underlying isolation material; and
   removing the underlying isolation material to form the self-aligning contact openings.

9. A method of forming self-aligned contacts for a semiconductor assembly comprising the following sequence of steps:
   patterning a photoresist layer overlying an anti-reflective layer to have exposed regions and non-exposed regions, the anti-reflective layer overlying a carbon layer;
   removing the photoresist layer and the anti-reflective layer in the exposed regions to expose an underlying area of the carbon layer;
   partially removing the carbon layer in the exposed underlying area such that at least half the thickness of the carbon layer is removed;
   removing the photoresist layer and the anti-reflective layer in the non-exposed regions;
   etching the carbon layer in the exposed underlying area until an underlying isolation material is encountered and the carbon layer is completely cleared from the underlying isolation material;
   removing the underlying isolation material at the exposed regions to form a self-aligned contact openings; and
   forming conductive material into the self-aligned contact openings to form the self-aligned contacts.

* * * * *